(12) United States Patent
Nose

(10) Patent No.: US 11,018,013 B2
(45) Date of Patent: May 25, 2021

(54) SEMICONDUCTOR DEVICE MANUFACTURING METHOD AND SEMICONDUCTOR DEVICE

(71) Applicant: SUMITOMO ELECTRIC DEVICE INNOVATIONS, INC., Kanagawa (JP)

(72) Inventor: Yukinori Nose, Yokohama (JP)

(73) Assignee: SUMITOMO ELECTRIC DEVICE INNOVATIONS, INC., Kanagawa (JP)

(*) Notice: Subject to any disclaimer, the term of this patent is extended or adjusted under 35 U.S.C. 154(b) by 0 days.

(21) Appl. No.: 16/436,254

(22) Filed: Jun. 10, 2019

(65) Prior Publication Data

US 2019/0385859 A1 Dec. 19, 2019

(30) Foreign Application Priority Data

Jun. 13, 2018 (JP) .............................. JP2018-112750

(51) Int. Cl.
| | | |
|---|---|---|
| H01L 21/285 | (2006.01) | |
| H01L 21/02 | (2006.01) | |
| H01L 29/778 | (2006.01) | |
| H01L 29/66 | (2006.01) | |
| H01L 29/20 | (2006.01) | |
| H01L 29/205 | (2006.01) | |
| H01L 29/47 | (2006.01) | |

(52) U.S. Cl.
CPC .... *H01L 21/28581* (2013.01); *H01L 21/0217* (2013.01); *H01L 21/02175* (2013.01); *H01L 21/02244* (2013.01); *H01L 21/02274* (2013.01); *H01L 29/2003* (2013.01); *H01L 29/205* (2013.01); *H01L 29/475* (2013.01); *H01L 29/66462* (2013.01); *H01L 29/7787* (2013.01)

(58) Field of Classification Search
CPC ........... H01L 21/28581; H01L 21/0217; H01L 21/02175; H01L 21/02244; H01L 29/7787; H01L 29/66462; H01L 29/2003; H01L 29/205; H01L 29/475; H01L 21/02274; H01L 21/0272; H01L 21/02255; H01L 29/41766; H01L 21/28575; H01L 21/3245
See application file for complete search history.

(56) References Cited

U.S. PATENT DOCUMENTS

| | | | |
|---|---|---|---|
| 6,618,409 B1* | 9/2003 | Hu .......................... | H01L 33/44 372/43.01 |
| 2005/0151255 A1* | 7/2005 | Ando .................. | H01L 29/7781 257/750 |

(Continued)

FOREIGN PATENT DOCUMENTS

| | | |
|---|---|---|
| JP | 2013-529384 | 7/2013 |
| JP | 2013-207086 | 10/2013 |

(Continued)

*Primary Examiner* — Edward Chin
(74) *Attorney, Agent, or Firm* — Smith, Gambrell & Russell, LLP.

(57) ABSTRACT

A semiconductor device manufacturing method includes: forming an electrode including an Ni layer and an Au layer successively stacked on a semiconductor layer; forming a Ni oxide film by performing heat treatment to the electrode at a temperature of 350° C. or more to deposit Ni at least at a part of a surface of the Au layer and to oxidize the deposited Ni; and forming an insulating film in contact with the Ni oxide film and containing Si.

6 Claims, 9 Drawing Sheets

(56) References Cited

U.S. PATENT DOCUMENTS

| | | | | |
|---|---|---|---|---|
| 2009/0057720 A1* | 3/2009 | Kaneko | ............... | H01L 29/432 |
| | | | | 257/194 |
| 2009/0278172 A1* | 11/2009 | Kaya | ............... | H01L 29/7787 |
| | | | | 257/192 |
| 2010/0006894 A1* | 1/2010 | Ohta | ............... | H01L 29/66734 |
| | | | | 257/192 |
| 2010/0038705 A1* | 2/2010 | Doris | ............... | H01L 21/28026 |
| | | | | 257/327 |
| 2013/0256755 A1* | 10/2013 | Kurachi | ............ | H01L 29/7787 |
| | | | | 257/194 |
| 2014/0001640 A1* | 1/2014 | Nishizawa | ........... | H01L 29/475 |
| | | | | 257/773 |
| 2014/0332822 A1* | 11/2014 | Takeya | ............. | H01L 29/66431 |
| | | | | 257/76 |
| 2016/0111497 A1* | 4/2016 | Simin | ............... | H01L 29/7786 |
| | | | | 257/365 |

FOREIGN PATENT DOCUMENTS

| | | |
|---|---|---|
| JP | 2016-103646 | 6/2016 |
| WO | 2011/143002 | 11/2011 |

\* cited by examiner

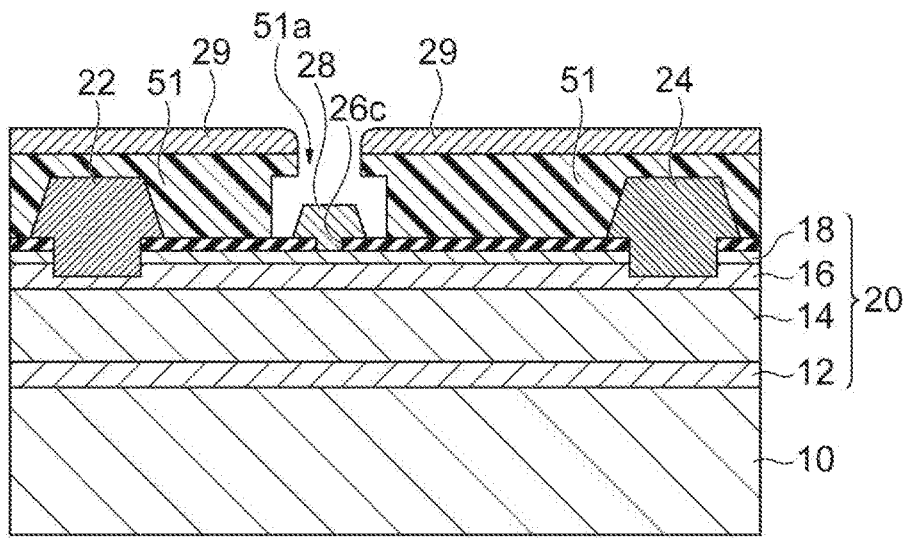
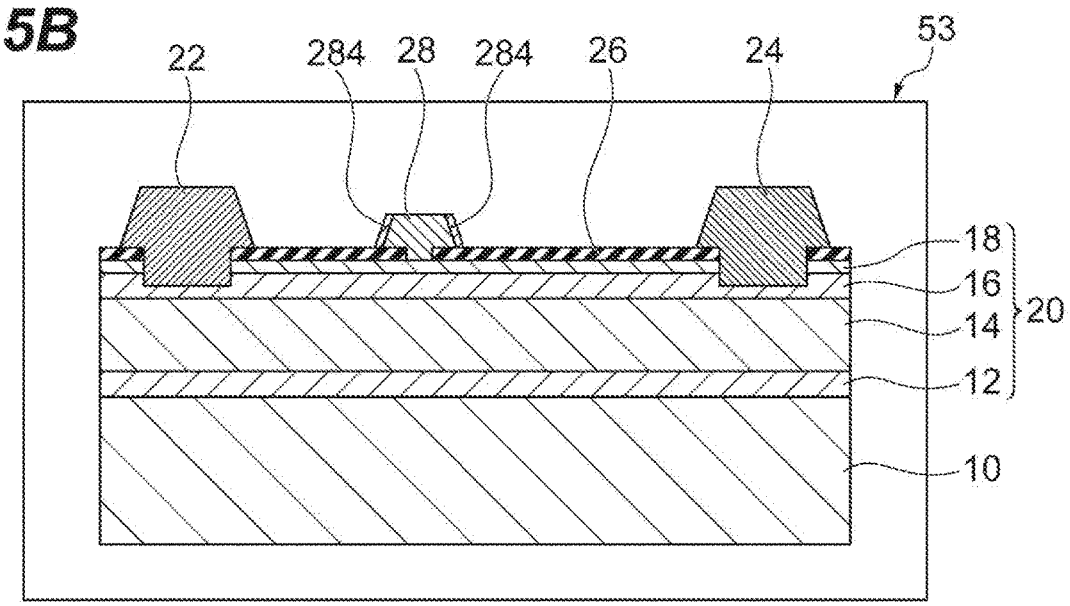
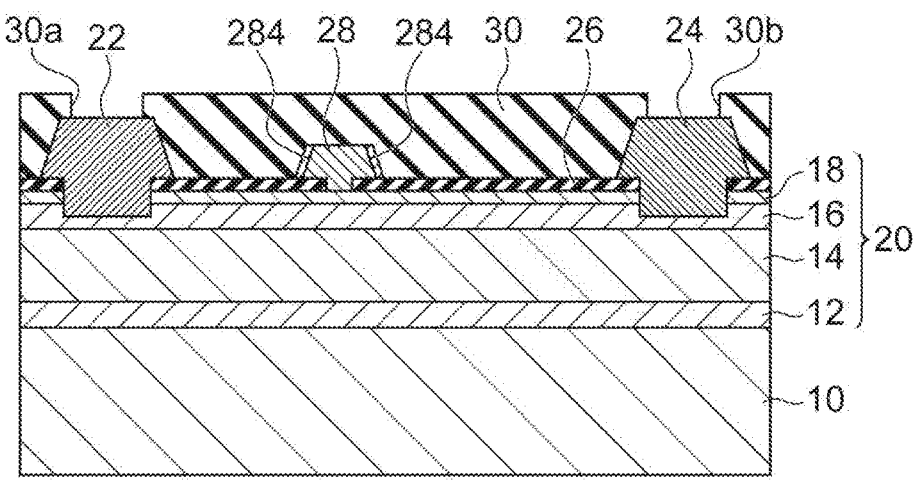

SEMICONDUCTOR DEVICE MANUFACTURING METHOD AND SEMICONDUCTOR DEVICE

CROSS REFERENCE TO RELATED APPLICATIONS

This application claims the priority benefit of Japanese Application No. JP2018-112750 filed on Jun. 13, 2018, the entire contents of which are incorporated herein by references.

TECHNICAL FIELD

The present disclosure relates to a semiconductor device manufacturing method and a semiconductor device.

BACKGROUND

Japanese Unexamined Patent Publication No. 2016-103646 discloses a high electron mobility transistor (HEMT) formed of a nitride semiconductor. The HEMT includes a source electrode, a drain electrode, and a gate electrode formed on a nitride semiconductor layer. The nitride semiconductor layer is covered with an insulating film formed of a material containing one of silicon oxide, silicon nitride, and silicon oxynitride. The gate electrode is in contact with the nitride semiconductor layer via an opening formed in the insulating film. The gate electrode has an Ni layer in contact with the nitride semiconductor layer, and an Au layer provided on the Ni layer.

Japanese Unexamined Patent Publication No. 2013-529384 discloses a semiconductor device including a wide-bandgap semiconductor layer and a Schottky electrode as a gate provided on the semiconductor layer. The Schottky electrode includes a nickel oxide layer in contact with the semiconductor layer.

In a semiconductor device, there is provided on the semiconductor layer a Schottky electrode in contact with the semiconductor layer. For example, in a transistor such as HEMT, a Schottky electrode is used as the gate. In some cases, in order to enlarge a Schottky barrier formed between the Schottky electrode and the semiconductor layer (in particular, the nitride semiconductor layer), the Schottky electrode has Ni in the layer in contact with the semiconductor layer. This is due to the fact that, of the high work function metals with low-reactivity, Ni has a relatively satisfactory close contact property with respect to the foundation, and is capable of forming a large Schottky barrier. Further, on the Ni layer, there is provided a thick Au layer. Au is chemically stable and exhibits large conductivity (2.3 μΩcm), so that it can reduce the resistance value of the Schottky electrode.

A semiconductor device, however, may be exposed to high temperature (e.g., 300° C. or more) in the course of its manufacturing process. When the semiconductor device is exposed to high temperature, Ni is gradually diffused from the Ni layer to the Au layer, and reaches the surface of the Au layer. In many cases, around the Schottky electrode, there is provided an insulating film containing Si (e.g., an SiN film). The Ni having reached the surface of the Au layer is diffused in the insulating film. In this case, the Ni is connected with the Si of the insulating film to form nickel silicide. As a result, the insulation property of the insulating film deteriorates. When the insulation property of the insulating film deteriorates, the pressure resistance performance of the semiconductor device deteriorates. Further, in the case where the Schottky electrode is the gate electrode of a transistor, the gate leak electrode tends to increase. This diffusion of the Ni in the insulating film and the formation of nickel silicide progress also during normal operation of the semiconductor device.

SUMMARY

According to an embodiment of the present disclosure, there is provided a semiconductor device manufacturing method comprising: forming an electrode including an Ni layer and an Au layer successively stacked on a semiconductor layer; forming a Ni oxide film by performing heat treatment to the electrode at a temperature of 350° C. or more to deposit Ni at least at a part of a surface of the Au layer and to oxidize the deposited Ni; and forming an insulating film in contact with the Ni oxide film and containing Si.

In accordance with an embodiment, there is provided a semiconductor device comprising: a semiconductor layer; an electrode including an Ni layer in contact with the semiconductor layer and an Au layer provided on the Ni layer and including an Ni oxide film at least at a part of a surface of the Au layer; and an insulating film in contact with the Ni oxide film and containing Si.

BRIEF DESCRIPTION OF THE DRAWINGS

The foregoing and other purposes, aspects and advantages will be better understood from the following detailed description of a preferred embodiment of the invention with reference to the drawings, in which:

FIGS. 5A to 5C are sectional views showing the steps of the HEMT manufacturing method;

DETAILED DESCRIPTION

Figure 1:
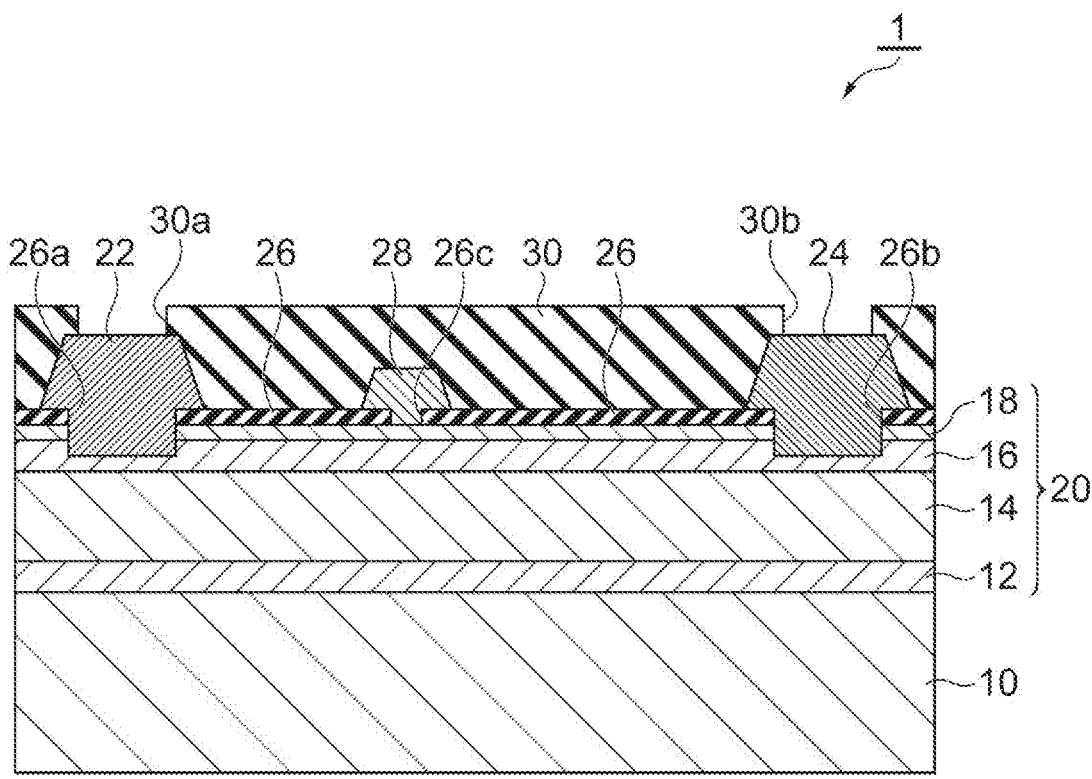
FIG. 1 is a sectional view illustrating the structure of a high electron mobility transistor (HEMT) as an example of a semiconductor device.

In the following, specific examples of the semiconductor device manufacturing method and the semiconductor device according to an embodiment of the present disclosure will be described with reference to the drawings. The present disclosure is not limited to these examples, and it is intended that all variations indicated in the claims and within the sense and scope equivalent to those of the claims should be included. In the following description, the same components are designated by the same reference numerals in the explanation of the drawings, and a redundant description will be left out.

FIG. 1 is a sectional view illustrating the structure of a high electron mobility transistor (HEMT) as an example of the semiconductor device according to the embodiment. As shown in FIG. 1, the HEMT 1 of the present embodiment includes a substrate 10, and a semiconductor stack 20 (semiconductor layer) including a plurality of nitride semiconductor layers and provided on the substrate 10. The substrate 10 is an SiC substrate having, for example, (0001) surface, and the stacking direction of the semiconductor stack 20 is, for example, [0001] direction. The semiconductor stack 20 includes a nucleation layer 12, a channel layer 14, a barrier layer 16, and a cap layer 18 formed in that order from the substrate 10 side. The nucleation layer 12 functions as a seed layer with respect to the channel layer 14. The nucleation layer 12 is, for example, an AlN layer, and its thickness ranges, for example, from 5 nm to 20 nm. The channel layer 14 is a semiconductor layer formed through epitaxial growth on the nucleation layer 12, and functions as an electron transit layer. The channel layer 14 is, for example, an undoped GaN layer. The thickness of the channel layer 14 is, for example, 500 nm.

The barrier layer 16 is a semiconductor layer formed on the channel layer 14 through epitaxial growth, and functions as an electron supply layer. The barrier layer 16 is, for example, an AlGaN layer, an InAlN layer, or an InAlGaN layer. The band gap of the barrier layer 16 is larger than the band gap of the channel layer 14. In the case where the barrier layer 16 is an AlGaN layer, the Al composition thereof is, for example, not less than 0.15 and not more than 0.35. The conduction type of the barrier layer 16 is n-type or undoped type (i-type). The barrier layer 16 and the channel layer 14 may be in contact with each other, or a spacer layer (not shown) may exist between the barrier layer 16 and the channel layer 14. The thickness of the barrier layer 16 ranges, for example, from 5 nm to 30 nm. Due to a difference in lattice constant, distortion is generated between the barrier layer 16 and the channel layer 14. As a result, in the vicinity of the interface between the barrier layer 16 and the channel layer 14 and in the channel layer 14 side region, there is generated a two-dimensional electron gas (2DEG) attributable to a piezoelectric charge, with the result that a channel region is formed.

The cap layer 18 is a semiconductor layer formed on the barrier layer 16 through epitaxial growth. The cap layer 18 is, for example, a GaN layer. The thickness of the cap layer 18 is, for example, 5 nm. The conduction type of the cap layer 18 is, for example, n-type.

The HEMT 1 further includes an SiN passivation film 26. The thickness of the SiN passivation film 26 is, for example, 10 to 100 nm. The SiN passivation film 26 has a source opening 26a, a drain opening 26b, and a gate opening 26c. At these openings 26a through 26c, the semiconductor stack 20 is exposed from the SiN passivation film 26. More specifically, at the source opening 26a and the drain opening 26b, the cap layer 18 is removed, and the barrier layer 16 is exposed. At the gate opening 26c, the cap layer 18 is exposed.

The HEMT 1 further includes a source electrode 22, a drain electrode 24, and a gate electrode 28. The source electrode 22 and the drain electrode 24 are arranged side by side along the surface of the substrate 10. The source electrode 22 covers the source opening 26a of the SiN passivation film 26, and forms ohmic contact with the barrier layer 16 via the source opening 26a. The drain electrode 24 covers the drain opening 26b of the SiN passivation film 26, and forms ohmic contact with the barrier layer 16 via the drain opening 26b. The source electrode 22 and the drain electrode 24 are formed through heat treatment (alloying) of the titanium (Ti) layer and the aluminum (Al) layer provided in that order from the semiconductor stack 20 side. Before the heat treatment, the thickness of the Ti layer is, for example, 30 nm, and the thickness of the Al layer is, for example, 300 nm. Instead of the Ti layer, a Ta layer may be provided.

Figure 2:
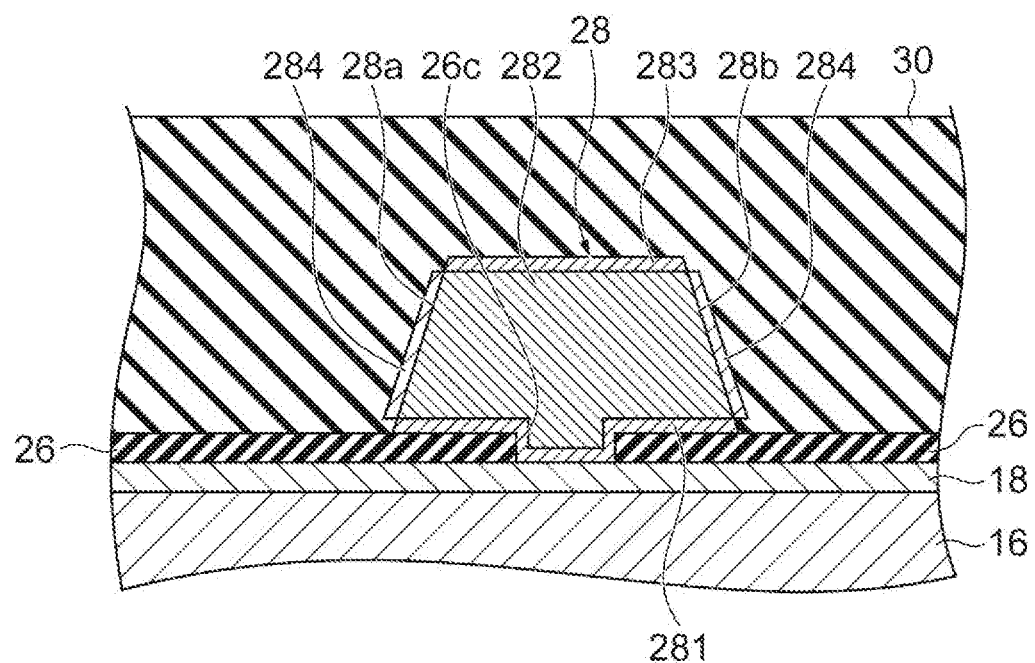
FIG. 2 is an enlarged sectional view showing a gate electrode.

The gate electrode 28 is provided between the source electrode 22 and the drain electrode 24 on the semiconductor stack 20. FIG. 2 is an enlarged sectional view of the gate electrode 28. As shown in FIG. 2, the gate electrode 28 covers the gate opening 26c of the SiN passivation film 26, and forms Schottky contact with the cap layer 18 via the gate opening 26c. The gate electrode 28 has a nickel (Ni) layer 281, a gold (Au) layer 282, and a tantalum (Ta) layer 283 provided in that order from the semiconductor stack 20 side. The thickness of the Ni layer 281 ranges, for example, from 20 to 100 nm. In an example, it is 60 nm. The thickness of the Au layer 282 ranges, for example, from 350 to 800 nm. In an example, it is 350 nm. The thickness of the Ta layer 283 is, for example, 10 nm.

The gate electrode 28 has a portion formed in the gate opening 26c and formed above the same, and a portion formed on the side of the above-mentioned portion and having ridden on the SiN passivation film 26. The gate electrode 28 on the SiN passivation film 26 has a pair of side surfaces 28a and 28b which are inclined with respect to the upper surface of the SiN passivation film 26. The further the pair of side surfaces 28a and 28b approach each other, the further they are spaced away from the semiconductor stack 20. Thus, the sectional shape of the gate electrode 28 excluding the portion thereof formed in the gate opening 26c is substantially of a trapezoidal shape.

The Ni layer 281 extends from the semiconductor stack 20 in the gate opening 26c onto the SiN passivation film 26 via the side surface of the gate opening 26c. The Au layer 282 is provided on the Ni layer 281 in such a way as to extend from within the gate opening 26c onto the Ni layer 281 over the SiN passivation film 26, and is in contact with the Ni layer 281. The pair of side surfaces 28a and 28b of the gate electrode 28 are mainly formed by the Au layer 282. The Ta layer 283 constitutes the upper surface of the trapezoidal gate electrode 28, but is not formed on the pair of side surfaces 28a and 28b.

The Ni atoms of the Ni layer 281 are diffused altogether within the Au layer 282. At least at a part of the surface of the Au layer 282 (in the present embodiment, the surface of the Au layer 282 corresponding to the pair of side surfaces 28a and 28b), the deposited Ni atoms are combined with oxygen atoms O to form Ni oxide. As a result, an NI oxide film 284 is generated on the surface of the Au layer 282 corresponding to the pair of side surfaces 28a and 28b. The Ni oxide film 284 covers all (or a part) of the surface of the Au layer 282 exposed from the Ta layer 283 and the Ni layer 281. The thickness of the Ni oxide film 284 ranges, for example, from 5 to 10 nm. In this embodiment, the deposited Ni on the surface of the Au layer 282 corresponds to not an evaporated Ni but a moved Ni from the Ni layer 281 onto the surface of the Au layer 282.

The HEMT 1 further includes an insulating film 30. As shown in FIG. 2, the insulating film 30 is a protective film covering the gate electrode 28, and is in contact with the Ni oxide film 284. The insulating film 30 is formed of an insulating material containing Si. The insulating film 30 is, for example, an SiN film, an $SiO_2$ film, or an SiON film. The thickness of the insulating film 30 ranges, for example, from 200 to 400 nm. As shown in FIG. 1, the insulating film 30 has openings 30a and 30b. The source electrode 22 is exposed from the opening 30a, and the drain electrode 24 is exposed from the opening 30b. The opening 30a is provided with wiring (not shown) connected to the source electrode 22, and the opening 30b is provided with wiring (not shown) connected to the drain electrode 23.

Figure 3A:
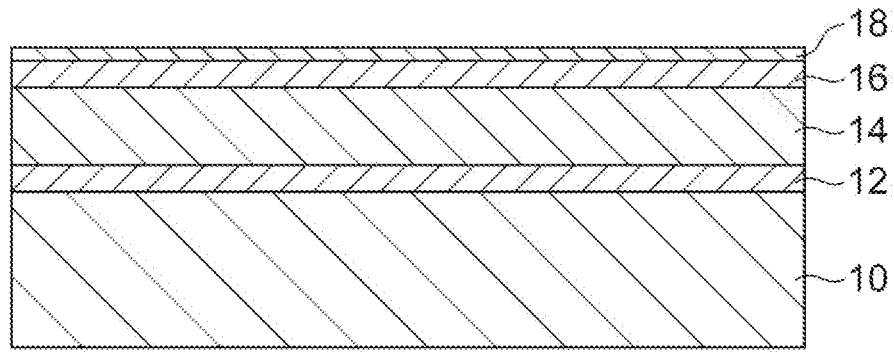
FIGS. 3A to 3C are sectional views showing the steps of an HEMT manufacturing method.

Subsequently, an example of the manufacturing method for the HEMT 1 will be described with reference to FIGS. 3A through 5C. As shown in FIG. 3A, by using an organometallic vapor phase growth method (MOCVD), the semiconductor stack 20 including a plurality of nitride semiconductor layers forms on the substrate 10. More specifically, first, the nucleation layer 12 grows on the substrate 10. In the case where the nucleation layer 12 is an AlN layer, the material gas includes, for example, TMA (trimethyl aluminum) and $NH_3$ (ammonia), and the growth temperature is, for example, 1100° C. Next, the channel layer 14 grows on the nucleation layer 12. In the case where the channel layer 14 is a GaN layer, the material gas includes, for example, TMG (trymethyl gallium) and $NH_3$, and the growth temperature is, for example, 1050° C. Subsequently, the barrier layer 16 grows on the channel layer 14. In the case where the barrier layer 16 is an AlGaN layer, the material gas includes, for example, TMA, TMG, and $NH_3$, and the growth temperature is, for example, 1050° C. Subsequently, the cap layer 18 grows on the barrier layer 16. In the case where the cap layer 18 is a GaN layer, the material gas includes, for example, TMG and $NH_3$, and the growth temperature is, for example, 1050° C.

Figure 3B:
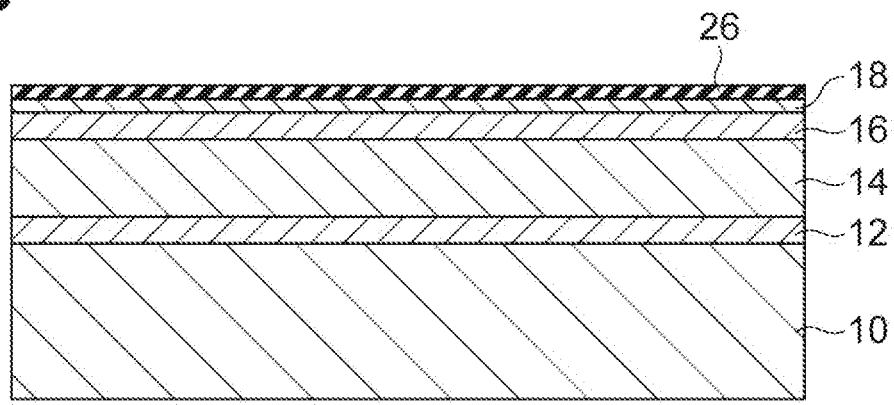

Next, as shown in FIG. 3B, the SiN passivation film 26 in contact with the upper surface of the semiconductor stack 20 is formed by using at least one of the reduced pressure CVD method and the plasma CVD method. In the case where the reduced pressure CVD method is used, the film formation temperature ranges, for example, from 600 to 850° C., and the growth pressure ranges, for example, from 10 to 50 Pa. As compared with the case where the plasma CVD method is used, in the case where the reduced pressure CVD method is used, the SiN passivation film 26 formed is more densified and harder. After the formation of a part (the lower portion) of the SiN passivation film 26 by the reduced pressure CVD method, the remaining portion (the upper portion) of the SiN passivation film 26 may be formed by the plasma CVD method. In the case where the film is formed by the reduced pressure CVD method, ammonia gas and dichlorosilane ($SiH_2Cl_2$) are used as the material gas.

Figure 3C:
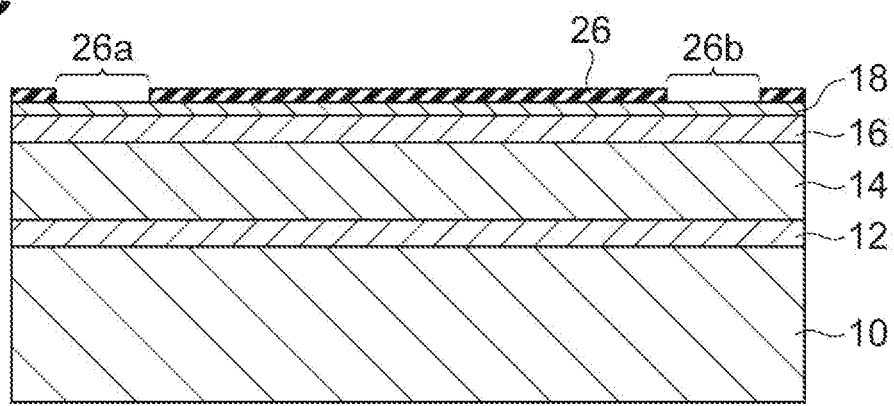
Figure 4A:
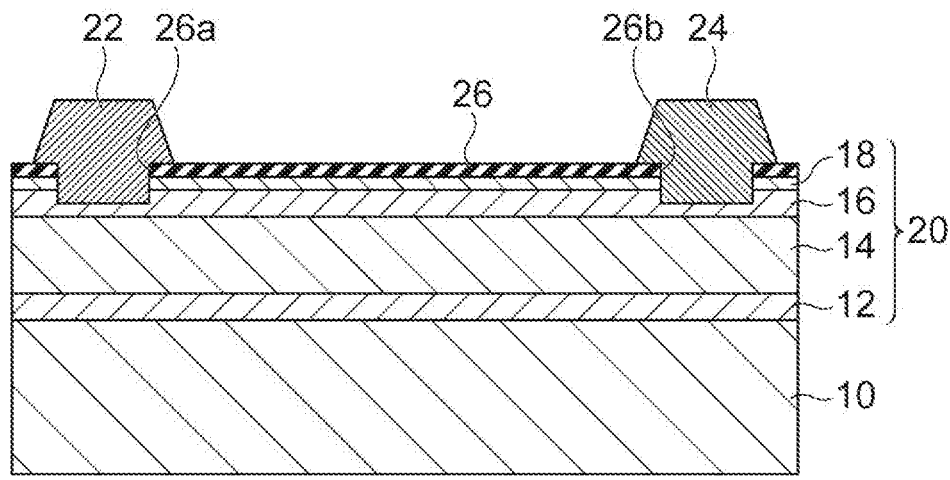
FIGS. 4A to 4C are sectional views showing the steps of the HEMT manufacturing method.

Subsequently, as shown in FIG. 3C, the source opening 26a and the drain opening 26b are formed in the SiN passivation film 26. The source opening 26a and the drain opening 26b are formed by forming, on the SiN passivation film 26, a resist mask having openings respectively corresponding to the source opening 26a and the drain opening 26b, and by etching on the SiN passivation film 26 via the resist mask. The etching is reactive ion etching (RIE) using a reactive gas containing, for example, fluorine (F) atoms. After this, the cap layer 18 in the openings 26a and 26b is etched to expose the barrier layer 16, and then, as shown in FIG. 4A, by using lithography and lift-off technique, the source electrode 22 and the drain electrode 24 respectively covering the openings 26a and 26b are formed through evaporation. After this, alloying through heat treatment is performed at a temperature of 500° C. or more.

Figure 4B:
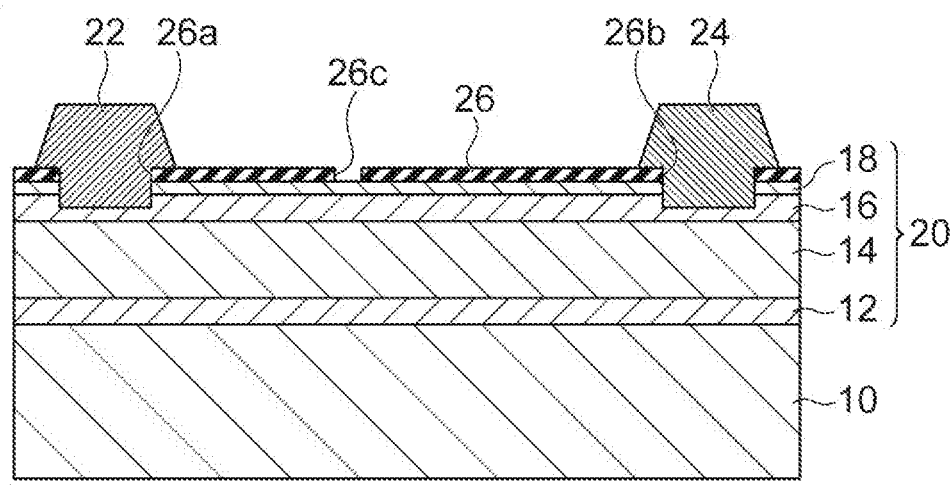

Subsequently, as shown in FIG. 4B, the gate opening 26c is formed in the SiN passivation film 26. A resist mask having an opening corresponding to the gate opening 26c is formed on the SiN passivation film 26, and etching is performed on the SiN passivation film 26 via the resist mask, thereby forming the gate opening 26c. The etching is RIE using a reactive gas containing, for example, F atoms. After this, the resist mask is removed.

Figure 4C:
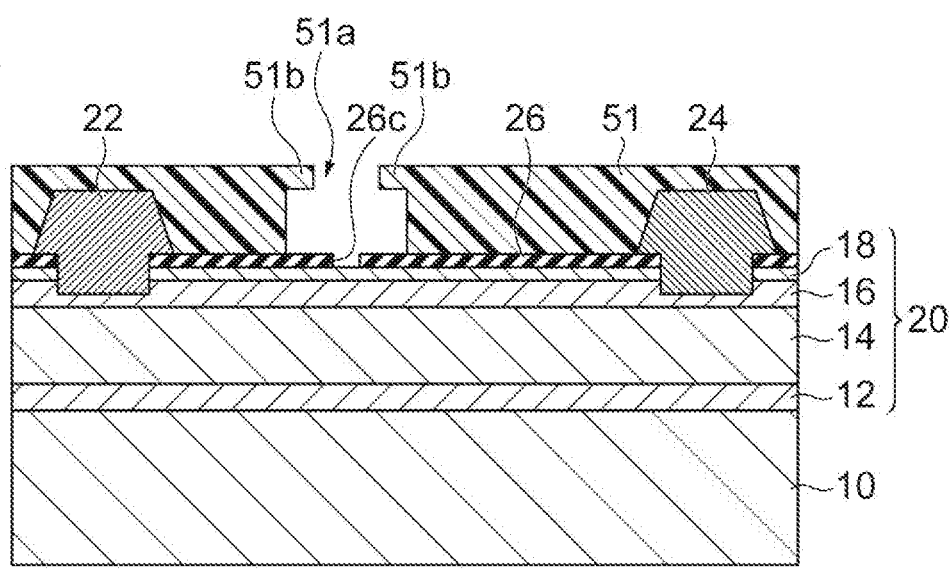

Subsequently, as shown in FIG. 4C, resist 51 is applied to the SiN passivation film 26. By the lithography technique, the opening 51a of the resist 51 is formed on the gate opening 26c. The opening 51a formed in the resist 51 is wider than the gate opening 26c. Further, the opening 51a has an eaves portion 51b. Inside the opening 51a, the cap layer 18 is exposed within the gate opening 26c, and the SiN passivation film 26 located around the gate opening 26c is exposed.

Subsequently, as shown in FIG. 5A, the gate electrode 28 in contact with the cap layer 18 via the gate opening 26c is formed by evaporation (the first step in the present embodiment). More specifically, the Ni layer 281, the Au layer 282, and the Ta layer 283 are evaporated in that order. At this time, the sectional shape of the gate electrode 28 is trapezoidal, and the Ta layer 283 is deposited on the upper surface of the trapezoid. Thus, the Au layer 282 is exposed from a pair of side surfaces of the trapezoid. The metal 29 deposited on the resist 51 is removed along with the resist 51 (lift-off).

Subsequently, as shown in FIG. 5B, the periphery of the gate electrode 28 is placed in an atmosphere containing oxygen gas ($O_2$), and in this state, the heat treatment of the gate electrode 28 is conducted in a heat treatment furnace 53 (the second step in the present embodiment). The temperature of the heat treatment is, for example, not less than 350° C. and not more than 420° C. In an example, it is 350° C. The time for the heat treatment is, for example, not less than 15 minutes and not more than 30 minutes. In an example, it is 15 minutes. The ambient atmosphere of the gate electrode 28 mainly contains nitride ($N_2$), and the oxygen concentration in the atmosphere may be 21% or less. In an example, the ambient atmosphere of the gate electrode 28 is atmospheric air.

In this step, a part of the Ni atoms constituting the Ni layer 281 is gradually diffused in the Au layer 282, and, after a fixed period of time, Ni atoms are distributed throughout the Au layer 282. A part of the Ni atoms diffused in the Au layer 282 reaches the exposed surface of the Au layer 282, and is deposited on the surface. At this time, the deposited Ni atoms react with the $O_2$ gas to be oxidized, forming the Ni oxide film 284 on the surface of the Au layer 282. In this way, in the present embodiment, the deposition and oxidation of Ni are effected simultaneously. At this time, the source electrode 22 and the drain electrode 24 are not substantially affected. This is due to the fact that the alloying of these electrodes is effected at a temperature sufficiently higher than the temperature of the diffusion and oxidation of Ni.

Subsequently, as shown in FIG. 5C, the insulating film 30 is formed on the SiN passivation film 26, for example, by the plasma CVD method, and the gate electrode 28 is covered with this insulating film 30 (the third step in the present embodiment). At this time, the insulating film 30 is in contact with the Ni oxide film 284. As the material gas, ammonia gas and mono-silane are used. After this, openings 30a and 30b are formed in the insulating film 30 by reactive ion etching using, for example, a fluorine-containing gas, and the source electrode 22 and the drain electrode 24 are exposed. Through the above process, the HEMT 1 is prepared.

Figure 6:
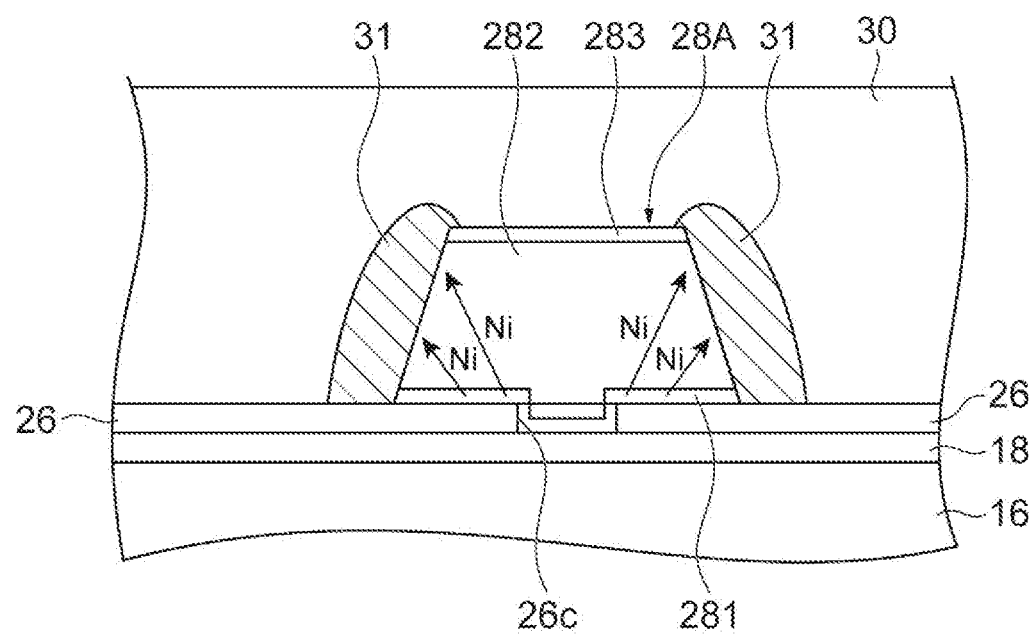
FIG. 6 is a schematic diagram for illustrating a problem in a gate electrode of a comparative example.

The effect attained by the HEMT 1 of the present embodiment constructed as described above and the manufacturing method thereof will be described along with the problem in the comparative example. FIG. 6 is a schematic view for illustrating the problem in a gate electrode 28A of the comparative example. The gate electrode 28A has a stacked structure of the Ni layer 281, the Au layer 282, and the Ta layer 283. In this case, due to a temperature rise in the semiconductor device attributable to heat generation or the like during operation, Ni is gradually diffused from the Ni layer 281 to the Au layer 282 (See the arrow in the drawing), and eventually reaches the surface of the Au layer 282. In many cases, around the gate electrode 28A, there is provided the insulating film 30 containing Si (e.g., an SiN film). The Ni having reached the surface of the Au layer 282 is diffused in the insulating film 30, and, in the region 31 in the insulating film 30 adjacent to the Au layer 282, forms silicide together with the Si of the insulating film 30. As a result, the insulation property of the insulating film 30 deteriorates. The deterioration in the insulation property of the insulating film 30 results in an increase in the gate leak electrode and deterioration in withstand pressure performance.

The reason why the Ni of the Ni layer 281 is easily diffused will be described. As described above, the gate electrode 28 covers the gate opening 26c, and includes a portion deposited on the semiconductor stack 20 inside the gate opening 26c (the cap layer 18 in the present embodiment), and a portion deposited on the SiN passivation film 26 outside the gate opening 26c. In this way, the structure in which the gate electrode 28 locates on the SiN passivation film 26 is important in terms of the electric field relaxation at the gate end portion (the portion where the SiN passivation film 26, the gate electrode 28, and the semiconductor stack 20 are in contact with each other).

Figure 7:
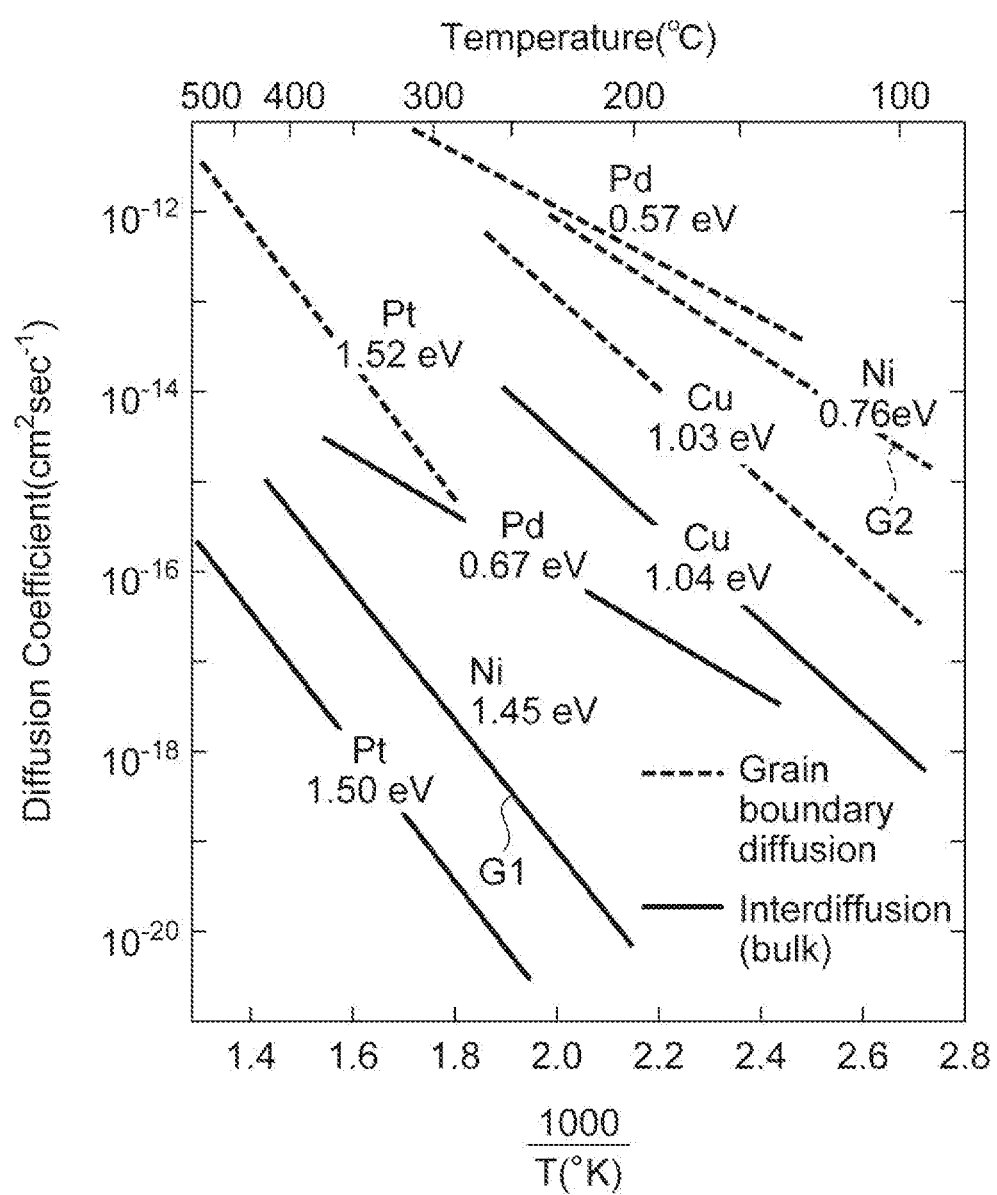
FIG. 7 is a diagram illustrating the Arrhenius plot of the diffusion coefficient of an impurity metal within an Au layer and the activation energy thereof.

FIG. 7 is a diagram illustrating the Arrhenius plot of the diffusion coefficients of the various metals in the Au layer and the activation energy thereof. In FIG. 7, the graph of the solid line indicates bulk diffusion, that is, the type of diffusion in which replacement with Au existing at the lattice points in the crystal grain is effected, or diffusion between the Au lattices. The graph of the dotted line indicates diffusion at the grain boundary (diffusion on the grain boundary). In the case of bulk diffusion, the diffusion coefficient is small. On the other hand, in the grain boundary, the Au density is low, so that the diffusion coefficient is large. As is apparent from this drawing, when diffusion coefficient of the grain boundary diffusion and that of bulk diffusion are compared with each other with respect to Ni, the former is overwhelmingly larger. It is to be regarded that the Ni diffusion in the Au is determined solely by the grain boundary diffusion. The diffusion coefficient thereof is of a significant value even at 350° C. That is, even at 350° C., the diffusion of Ni in the Au, in particular, grain boundary diffusion can be sufficiently generated, with the Ni easily reaching the Au surface. Thus, even at a temperature of, for example, 350° C., the Ni can easily reach the surface of the Au layer along the Au grain boundary.

It might be possible to solve this problem by, for example, heating the substrate 10 at the time of evaporation of the Au layer 282 to improve the magnitude of crystallographic orientation of Au layer and to enlarge the Au grain diameter. The gate electrode 28, however, is formed by the lift-off process using the resist (See FIG. 5A). Thus, it is substantially impossible to heat the substrate 10 with the resist formed thereon to a temperature (several hundred degrees) at which the grain size is increased. Further, it might be possible to cover the exposed surface of the Au layer 282 with a high-melting-point metal, thereby preventing diffusion of Ni from the Au layer 282 to the SiN passivation film 26. In that case, however, it would be necessary to form the high-melting-point metal by a process different from that for the gate metal formation (another lithography process), resulting in a rather large manufacturing load. While in the present embodiment the Ta layer 283 is formed as the high-melting-point metal, the Ta layer 283 can be successively formed with the formation of the Au layer through evaporation.

To solve the above problem, in the present embodiment, after the formation of the gate electrode 28, heat treatment is conducted at a temperature of 350° C. or more to thereby deposit Ni on the surface of the Au layer 282, and the deposited Ni is oxidized to form the Ni oxide film 284 (See FIG. 5B). The Ni oxide (NiO) is chemically more stable than the Ni silicide. Thus, the formation of Ni silicide by combining the Ni oxide film 284 deposited on the surface of the Au layer 282 with the Si in the insulating film can be prevented. The Ni oxide film 284 can be formed by a simple and easy method of heat-treating the gate electrode 28, and there is no need to perform photolithography processing.

Figure 8:
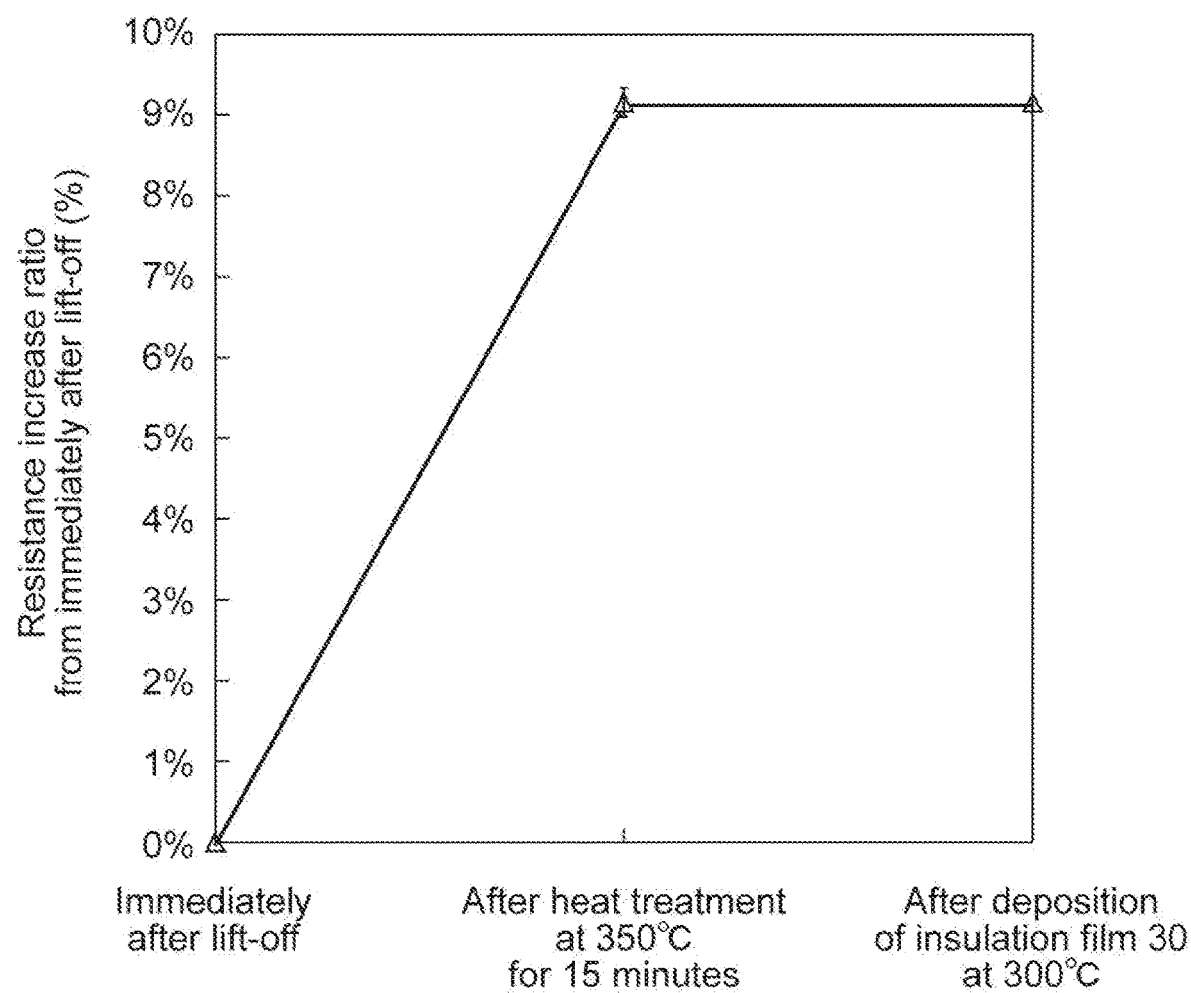
FIG. 8 is a graph showing the resistance increase ratio of the Au layer with passage of time immediately after lift-off.

The suitable temperature for the heat treatment shown in FIG. 5B will be described. FIG. 8 is a graph showing the resistance increase ratio of the Au layer 282 with passage of time from immediately after the lift-off. In FIG. 8, the abscissa indicates each step after the lift-off, and the ordinate indicates the resistance increase ratio (unit: %). The resistance increase ratio 0% is determined by using the resistance value of high purity Au (0%) as a reference. As shown in FIG. 8, through the heat treatment after the formation of the gate electrode 28 (350° C., 15 minutes), the resistance value of the Au layer 282 increases by nearly 9% from 0%. The increase in the resistance value means the diffusion of Ni. After this, when forming a part of the SiN film as the insulating film 30, the temperature is set to 300° C. At this temperature, however, the resistance value of the Au layer 282 scarcely increases. This means that almost no Ni has been diffused. From this, it can be seen that to sufficiently diffuse Ni in the Au layer 282 to cause it to reach the surface of the Au layer 282, the suitable heat treatment temperature is 350° C. or more.

In the present embodiment, the deposition and oxidation of Ni may be effected simultaneously by performing heat treatment in an atmosphere containing oxygen in the heat treatment process (FIG. 5B). This makes it possible to form the Ni oxide film 284 by a small number of processes. In this case, the atmosphere mainly contains nitrogen (N$_2$), and the oxygen concentration may be 21% or less. Since the oxidation of Ni is possible at this oxygen concentration, it is possible to easily form the Ni oxide film 284 by using, for example, atmospheric air.

In the present embodiment, the heat treatment may be conducted for 15 minutes or more. This makes it possible to sufficiently deposit Ni on the surface of the Au layer 282.

In the present embodiment, prior to the step of forming the gate electrode 28, the step of forming the SiN passivation film 26 on the semiconductor stack 20 by using at least one of the reduced pressure CVD method and the plasma CVD method (FIG. 3B) and the step of forming in the SiN passivation film 26 the opening 26a for exposing the semiconductor stack 20 (FIG. 4B) may be further performed, thereby forming the gate electrode 28 covering the opening 26a. Further, the HEMT 1 includes the SiN passivation film 26 provided on the semiconductor stack 20, and the SiN passivation film 26 has the opening 26a through which the semiconductor stack 20 is exposed, with the gate electrode 28 covering the opening 26a. In this case, Ni is easily diffused into the Au layer 282 in a portion of the Ni layer 281, the portion being deposited on the SiN passivation film 26 (the portion poor in crystallinity, or the portion where the grain size is small). Thus, the Ni oxide film 284 providing the above-mentioned effect proves particularly effective.

In the present embodiment, the insulating film 30 may be formed by using the plasma CVD method. In the insulating film 30 formed by the plasma CVD method, the inner crystalline structure is relatively non-dense, so that the Ni from the Au layer 282 is easily diffused through the grain boundary. Thus, the Ni oxide film 284 providing the above-mentioned effect proves particularly effective.

EXAMPLE

Subsequently, an example of the above embodiment will be described. In this example, after the steps shown in FIGS. 3A to 4C, the Ni layer 281 having a thickness of 60 nm, the Au layer 282 having a thickness of 350 nm, and the Ta layer 283 having a thickness of 10 nm were successively evaporated as the gate electrode 28. After this, heat treatment of 350° C./15 min. was conducted in an atmosphere containing oxygen, whereby the Ni of the Ni layer 281 was deposited on the side surfaces of the Au layer 282 and oxidized. After this, the substrate temperature was set to 300° C., and the insulating film 30 was formed by the plasma CVD method. Further, for the purpose of comparison, a gate electrode of a similar structure was formed, and then the insulating film 30 was formed by the plasma CVD method without conducting heat treatment in an atmosphere containing oxygen.

Figure 9A:
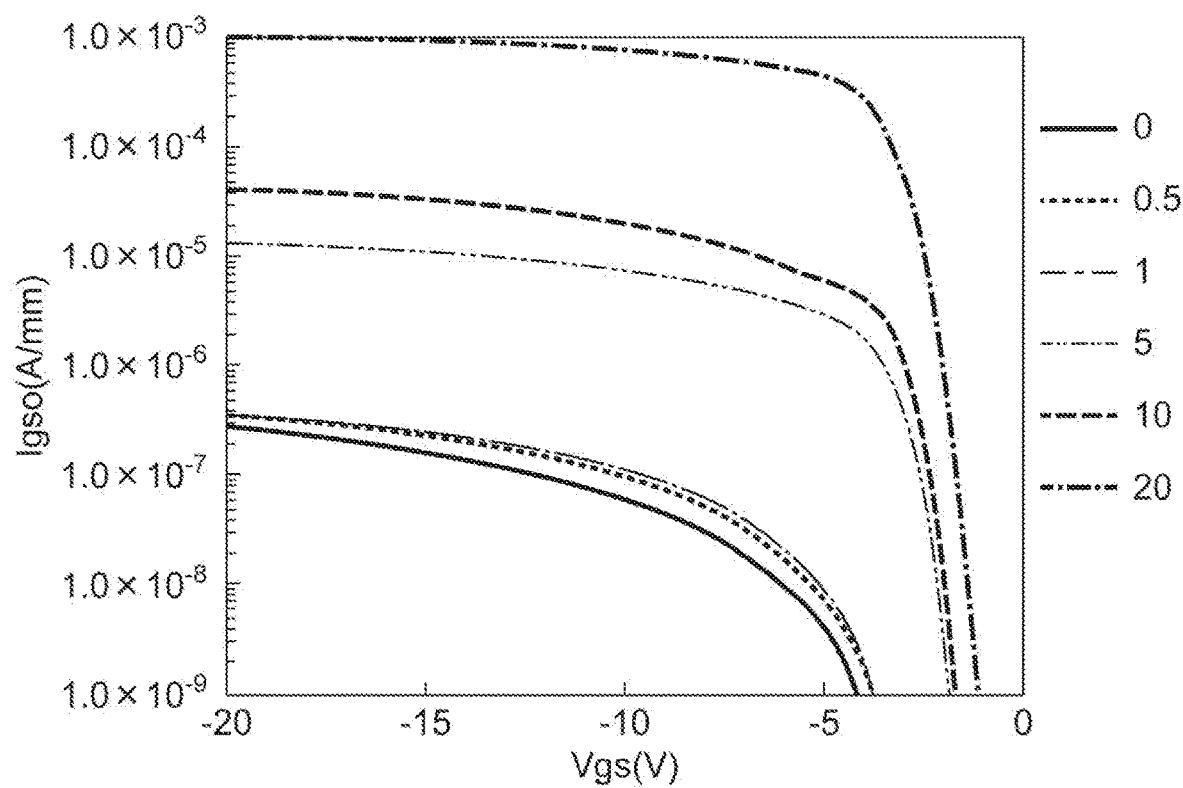
FIG. 9A is a graph illustrating the relationship between a gate leak current Igso and a gate-source voltage Vgs in the case where no heat treatment is conducted in an atmosphere containing oxygen.
Figure 9B:
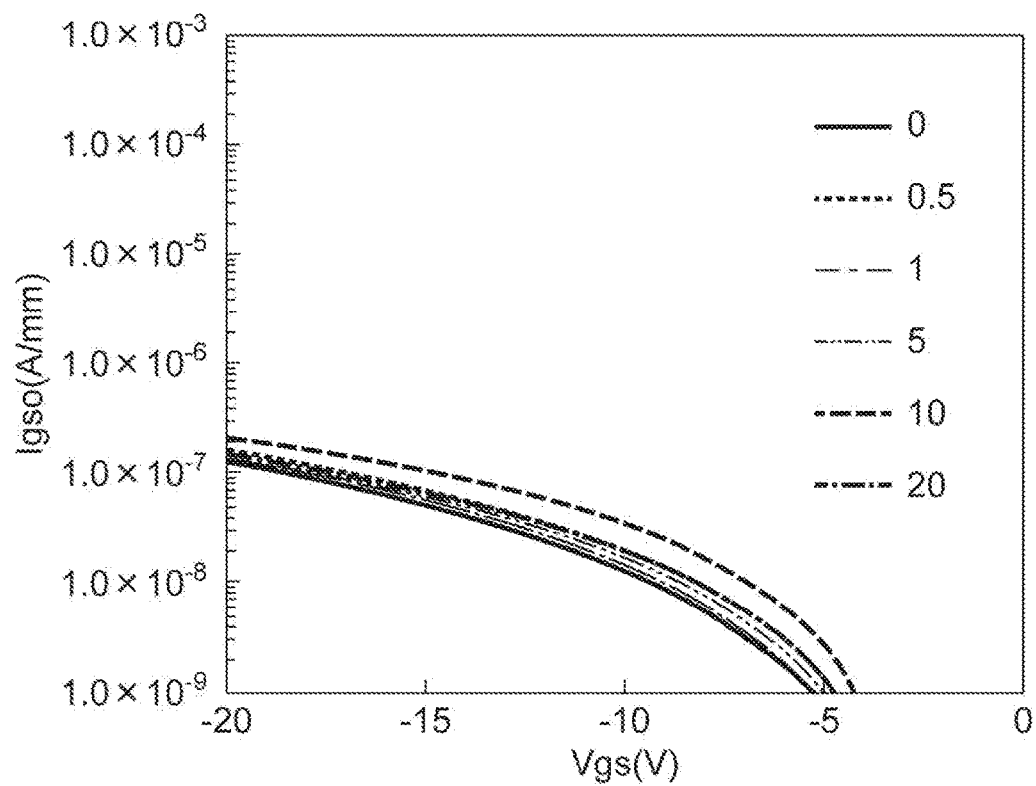
FIG. 9B is a graph illustrating the relationship between the gate leak current Igso and the gate-source voltage Vgs in the case where heat treatment is conducted in an atmosphere containing oxygen.

FIGS. 9A and 9B are graphs illustrating the relationship between the gate leak current Igso and the gate-source voltage Vgs. FIG. 9A is a graph in the case where no heat treatment is conducted in an atmosphere containing oxygen, and FIG. 9B is a graph in the case where heat treatment is conducted in an atmosphere containing oxygen. In the diagram, the value on the right-hand side indicates an accumulated standing time at 420° C. (unit: hour). 0 indicates the state immediately after the preparation. As shown in FIG. 9A, in the case where heat treatment in the atmosphere containing oxygen is not conducted, the gate leak current rises to a large value of $1.0\times10^{-3}$ (A/mm). In contrast, as shown in FIG. 9B, in the case where heat treatment in the atmosphere containing oxygen is conducted, the gate leak current is suppressed to a small value of $1.0\times10^{-7}$ (A/mm). In this way, in the above-described embodiment, the Ni oxide film 284 is formed on the side surfaces of the Au layer 282, whereby it is possible to effectively reduce the gate leak current.

The semiconductor device manufacturing method and the semiconductor device according to the present disclosure are not limited to the above-described embodiment but allow various other modifications. For example, while in the above-described embodiment Ni is oxidized by heat treatment in an atmosphere containing oxygen to form the Ni oxide film 284, the method of oxidizing Ni is not limited to this. For example, Ni may be oxidized by ashing, UV-$O_3$ processing or the like. The heat treatment in an atmosphere containing oxygen, however, is simplest and easiest. Further, while in the above embodiment the present disclosure is applied to the gate electrode of HEMT, the present disclosure is also applicable to the gate electrode of a transistor other than HEMT, or the Schottky electrode of a semiconductor device other than a transistor (in particular, a nitride semiconductor device).

What is claimed is:

1. A semiconductor device comprising:
a semiconductor layer;
a passivation layer formed on the semiconductor layer, the passivation layer having an opening exposing the semiconductor layer;
an electrode formed on the passivation layer and including an Ni layer, an Au layer provided on the Ni layer, a Ta layer provided on the Au layer, and an Ni oxide film provided on at least a part of a side surface of the Au layer;
and
an insulating film covering the electrode and the passivation layer, the insulating film being in contact with the Ni oxide film and containing Si,
wherein the Ni layer is formed on the passivation layer and is in contact with the semiconductor layer via the opening, the Ni layer covering the opening, and
wherein the Ni layer provides a bottom surface of the electrode, the Ta layer provides an upper surface of the electrode, and the Ni oxide film provides a side surface of the electrode.

2. The semiconductor device according to claim 1, wherein the Ni oxide film provides two side faces of the electrode.

3. The semiconductor device according to claim 1, wherein a thickness of the Au layer ranges from 20 to 100 nm,
wherein a thickness of the Ni layer ranges from 350 to 800 nm, and
wherein a thickness of the Ni oxide film ranges from 5 to 10 nm.

4. The semiconductor device according to claim 1, wherein a thickness of the Ta layer is 10 nm.

5. The semiconductor device according to claim 1, wherein the insulating film is formed of a SiN film, a $SiO_2$ film, or a SiON film.

6. The semiconductor device according to claim 5, wherein a thickness of the insulating film ranges from 200 to 400 nm.

* * * * *